(12) United States Patent
Violette (10) Patent No.: US 6,301,148 B1
(45) Date of Patent: Oct. 9, 2001

(54) METHOD OF ISOLATING A SRAM CELL (75) Inventor: Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/542,629

(22) Filed: Apr. 4, 2000

Related U.S. Application Data (62) Division of application No. 08/960,875, filed on Oct. 30, 1997, now Pat. No. 6,103,579, which is a continuation of application No. 08/819,546, filed on Mar. 17, 1997, now abandoned, which is a continuation of application No. 08/594,747, filed on Jan. 31, 1996, now abandoned.

(51) Int. Cl.$^7$ .............................. G11C 11/00; H01L 27/11
(52) U.S. Cl. .................. 365/156; 365/149; 365/154; 365/190; 257/369; 257/372
(58) Field of Search .................... 365/154, 156, 365/201, 207, 208, 149; 257/369, 372

(56) References Cited

U.S. PATENT DOCUMENTS

| | | | |
|---|---|---|---|
| 4,253,162 | 2/1981 | Hollingsworth | 365/175 |
| 4,849,366 | 7/1989 | Hsu et al. | 365/154 |
| 4,995,001 | 2/1991 | Dawson et al. | 365/154 |
| 5,153,852 | 10/1992 | Terrell | 365/154 |
| 5,182,810 | 1/1993 | Bartling et al. | 365/156 |
| 5,239,502 | 8/1993 | Carlstedt | 365/225.7 |
| 5,287,301 | 2/1994 | Redgrave . | |
| 5,307,142 | 4/1994 | Corbett et al. . | |
| 5,426,614 | 6/1995 | Harward . | |
| 5,535,166 | * 7/1996 | Bateman | 365/208 |
| 5,896,336 | 4/1999 | McClure . | |
| 5,949,706 | * 1/1999 | Chang et al. | 365/156 |
| 6,081,464 | * 6/2000 | Marr | 365/201 |

* cited by examiner

Primary Examiner—David Nelms
Assistant Examiner—Reneé R. Berry
(74) Attorney, Agent, or Firm—Wells, St. John, Roberts, Gregory & Matkin PS (57) ABSTRACT

A static random access memory cell comprising a first invertor including a first p-channel pullup transistor, and a first n-channel pulldown transistor in series with the first p-channel pullup transistor; a second invertor including a second p-channel pullup transistor, and a second n-channel pulldown transistor in series with the second n-channel pullup transistor, the first invertor being cross-coupled with the second invertor, the first and second pullup transistors sharing a common active area; a first access transistor having an active terminal connected to the first invertor; a second access transistor having an active terminal connected to the second invertor; and an isolator isolating the first pullup transistor from the second pullup transistor.

15 Claims, 7 Drawing Sheets

METHOD OF ISOLATING A SRAM CELL

RELATED PATENT DATA

This is a divisional patent application resulting from a continuation application, U.S. patent application Ser. No. 08/960,875, filed Oct. 30, 1997, entitled "A Method of Isolating a SRAM Cell", naming Michael P. Violette as inventor, now U.S. Pat. No. 6,103,579, which resulted from a continuation application, U.S. patent application Ser. No. 08/819,546, filed Mar. 17, 1997, now abandoned, which resulted from a con't Application. U.S. Pat. application Ser. No. 08/594,747, filed Jan. 31, 1996, now abandoned, the disclosure of which is incorporated by reference.

TECHNICAL FIELD

The invention relates to non-volatile static memory devices. More particularly, the invention relates to methods of manufacturing static random access memory devices.

BACKGROUND OF THE INVENTION

One known type of static read/write memory cell is a high-density static random access memory (SRAM). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper ($V_{cc}$ internal–$V_T$) and lower ($V_{ss}$) circuit supply voltages. Intermediate output voltages, between the upper ($V_{CC}$-$V_T$) and lower ($V_{SS}$) circuit supply voltages, generally do not occur except for during brief periods of memory cell power-up and during transitions from one operating state to the other operating state.

The operation of a static memory cell is in contrast to other types of memory cells such as dynamic cells which do not have stable operating states. A dynamic memory cell can be programmed to store a voltage which represents one of two binary values, blut requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell. Because of the significantly different architectural arrangements and functional requirements of static and dynamic memory cells and circuits, static memory design has developed along generally different paths than has the design of dynamic memories.

Figure 1:
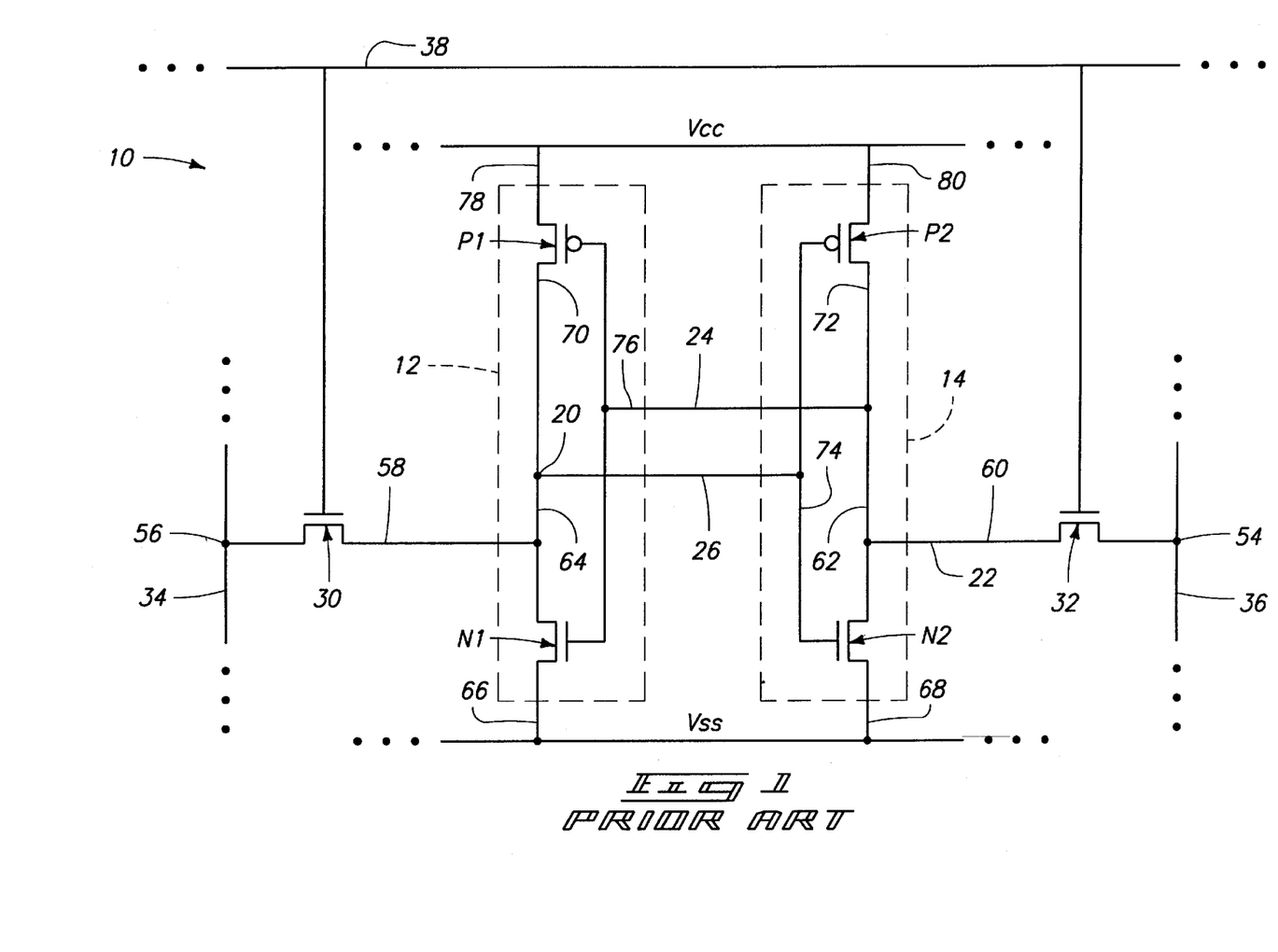
FIG. 1 is a circuit schematic of a static random access memory cell.

A static memory cell 10 is illustrated in FIG. 1. Static memory cell 10 generally comprises first and second inverters 12 and 14 which are cross-coupled to form a bistable flip-flop. Inverters 12 and 14 are formed by first and second n-channel pulldown (driver) transistors Ni and N2, and first and second p-channel load (pullup) transistors P1 and P2. Transistors N1 and N2 are typically metal oxide silicon field effect transistors (MOSFETs) formed in an underlying silicon semiconductor substrate. P-channel transistors P1 and P2 can be thin film transistors formed above the driver transistors or bull devices.

Driver transistors N1 and N2 have respective source: regions 66 and 68 tied to a low reference or circuit supply voltage, labelled $V_{ss}$, and typically referred to as "ground." Driver transistors N1 and N2 have respective drain regions 64 and 62, and respective gates. Load transistors P1 and P2 have respective source regions 78 and 80 tied to a high reference or circuit supply voltage, labelled $V_{cc}$, and have respective drain regions 70 and 72 tied to the drains 64 and 62, respectively, of the corresponding driver transistors N1 and N2. The gate of load transistor P1 is connected to the gate of driver transistor N1. The gate to load transistor P2 is connected to the gate of the driver transistor N2.

Inverter 12 has an inverter output 20 formed by the drain of driver transistor N1. Similarly, inverter 14 has an inverter output 22 formed by the drain of driver transistor N2. Inverter 12 has an inverter input 76 formed by the gate of driver transistor N1. Inverter 14 has an inverter input 74 formed by the gate of driver transistor N2.

The inputs and outputs of inverters 12 and 14 are cross-coupled to form a flip-flop having a pair of complementary two-state outputs. Specifically, inverter output 20 is coupled to inverter input 74 via line 26, and inverter output 22 is coupled to inverter input 76 via line 24. In this configuration, inverter outputs 20 and 22 form the complementary two-state outputs of the flip-flop.

A memory flip-flop such as that described typically forms one memory element of an integrated array of static memory elements. A plurality of access transistors, such as access transistors 30 and 32, are used to selectively address and access individual memory elements within the array. Access transistor 30 has one active terminal 58 connected to cross-coupled inverter output 20. Access transistor 32 has one active terminal 60 connected to cross-coupled inverter output 22. A pair of complementary column or bit lines 34 and 36 are connected to the remaining active terminals 56 and 54 of access transistors 30 and 32, respectively. A row or word line 38 is connected to the gates of access transistors 30 and 32. In the illustrated embodiment, access transistors 30 and 32 are n-channel transistors.

Reading static memory cell 10 requires activating row line 38 to connect inverter outputs 20 and 22 to column lines 34 and 36. Writing to static memory cell 10 requires complementary logic voltage on column lines 34 and 36 with row line 38 activated. This forces the outputs to the selected logic voltages, which will be maintained as long as power is supplied to the memory cell, or until the memory cell is reprogrammed.

In semiconductor processing, there is a continuing desire to make circuits denser, and to place components closer and closer together to reduce the size of circuits. However, certain processing steps employed in manufacturing static memory cells such as the static memory cell shown in FIG. 1 result in some undesirable variations between desired results and actual results in the manufacturing process. For example, there are precision limits inherent in photolithography. Another process that results in some undesirable variations between desired results and actual results is called LOCOS isolation (for LOCal Oxidation of Silicon). LOCOS isolation is a common technique for isolating devices.

Implementing a static memory cell on an integrated circuit involves connecting isolated circuit components or devices, such as flverters and access transistors, through specific electrical paths. When fabricating integrated circuits into a semiconductor substrate, devices within the substrate must be electrically isolated from other device s within the substrate. The devices are subsequently interconnected to create specific desired circuit configurations.

LOCOS isolation involves the formation of a semi-recessed oxide in the non-active (or field) areas of the bulk substrate. Such oxide is typically thermally grown by means of wet oxidation of the: bulk silicon substrate at temperatures of around 1000° C. for two to six hours. The oxide grows where there is no masking material over other silicon areas on the substrate. A typical masking material used to cover areas where field oxide is not desired is nitride, such as $Si_3N_4$.

However, at the edges of a nitride mask, some of the oxidant also diffuses laterally immediately there beneath. This causes oxide to grow under and lift the nitride edges. The shape of the oxide at the nitride edges is that of a slowly tapering oxide wedge that merges into a previously formed thin layer of pad oxide, and has beer termed as a "birds beak". The bird's beak is generally a lateral extension of the field oxide into the active areas of devices.

BRIEF DESCRIPTION OF THE DRAWINGS

Preferred embodiments of the invention are described below with reference to the following accompanying drawings.

FIG. 4 illustrates pullback that results during manufacturing when using the layout shown in FIGS. 2 and 3.

FIG. 7 is a circuit layout diagram for the layout shown in FIG. 6, with information removed for increased clarity. For example, local interconnects that are shown in FIG. 6 are deleted.

DETAILED DESCRIPTION OF THE PREFERRED EMBODIMENTS

The invention provides a static random access memory cell comprising a first p-channel pullup transistor having a gate, drain, and source; a first n-channel pulldown transistor having a gate, drain, and source; a second p-channel pullup transistor having a gate, drain, and is source; a second n-channel pulldown transistor having a gate, drain, and source; the source of the first pullup transistor being adapted to be connected to a first voltage; the source of the second pullup transistor being adapted to be connected to the first voltage; the drain of the first pulldown transistor being connected to the drain of the first pullup transistor; the drain of the second pulldown transistor being connected to the drain of the second pullup transistor; the source of the first pulldown transistor being adapted to be connected to a second voltage lower than the first voltage; the source of the second pulldown transistor being adapted to be connected to the second voltage; the gate of the first pullup transistor being connected to the gate of the first pulldown transistor; the gate of the second pullup transistor being connected to the gate of the second pulldown transistor; the first pullup transistor and the first pulldown transistor together defining a first inverter having an output defined by the drain of the first pulldown transistor and an input defined by the gate of the first pulldown transistor, the second pullup transistor and the second pulldown transistor together defining a second inverter having an output defined by the drain of the second pulldown transistor and an input defined by the gate of the second pulldown transistor, the input of the first inverter being connected to the output of the second inverter, and the input of the second inverter being connected to the output of the first inverter; and a p-channel isolation transistor connected between the drain of the first pullup transistor and the drain of the second pullup is transistor, and having a gate.

In one aspect of the invention, a static random access memory cell comprises a first inverter including a first p-channel pullup transistor, and a first n-channel pulldown transistor in series with the first p-channel pullup transistor; a second inverter including a second p-channel pullup transistor, and a second n-channel pulldown transistor in series with the second n-channel pullup transistor, the first inverter being cross-coupled with the second inverter, the first and second pullup transistors sharing a common active area; a first access transistor having an active terminal connected to the first inverter; a second access transistor having an active terminal connected to the second inverter; and an isolator isolating the first pullup transistor from the second pullup transistor.

In one aspect of the invention, a method of manufacturing a static random access memory cell including first and second cross-coupled inverters, each inverter including a p-channel transistor connected in series with an n-channel transistor, the p-channel transistors having sources that are connected to each other and that are adapted to be connected to a common first voltage, and the p-channel transistors having respective drains; the n-channel transistors having respective sources that are connected to each other and that are adapted to be connected to a common second voltage, lower than the first voltage, and the n-channel transistors having respective drains; the method comprising the following steps: providing a silicon substrate; defining the first and second inverters relative to the substrate and including an active area common to drains of the p-channel transistors; and defining an isolation gate relative to the common active area, between the drains of the p-channel transistors In one aspect of the invention, a method of manufacturing a wafer including a plurality of static random access memory cells, each cell including first and second cross-coupled inverters, each inverter including a p-channel transistor connected in series with an n-channel transistor, the p-channel transistors having sources that are connected together and that are adapted to be connected to a common first voltage, and having respective drains; the n-channel transistors having sources that are connected together and that are adapted to be connected to a common second voltage, lower than the first voltage, and having respective drains; the method comprising the following steps: providing a silicon substrate; defining active areas relative to the substrate for the static random access memory cells, the active areas including an active area having the general shape of a stepladder, including two parallel, spaced apart sides, and a plurality of parallel, spaced apart portions extending between the sides, such that the sides define drains of a plurality of the p-channel transistors; and defining respective isolation gates relative to active areas, between the drains of the p-channel transistors within each static random access memory cell.

Figure 2:
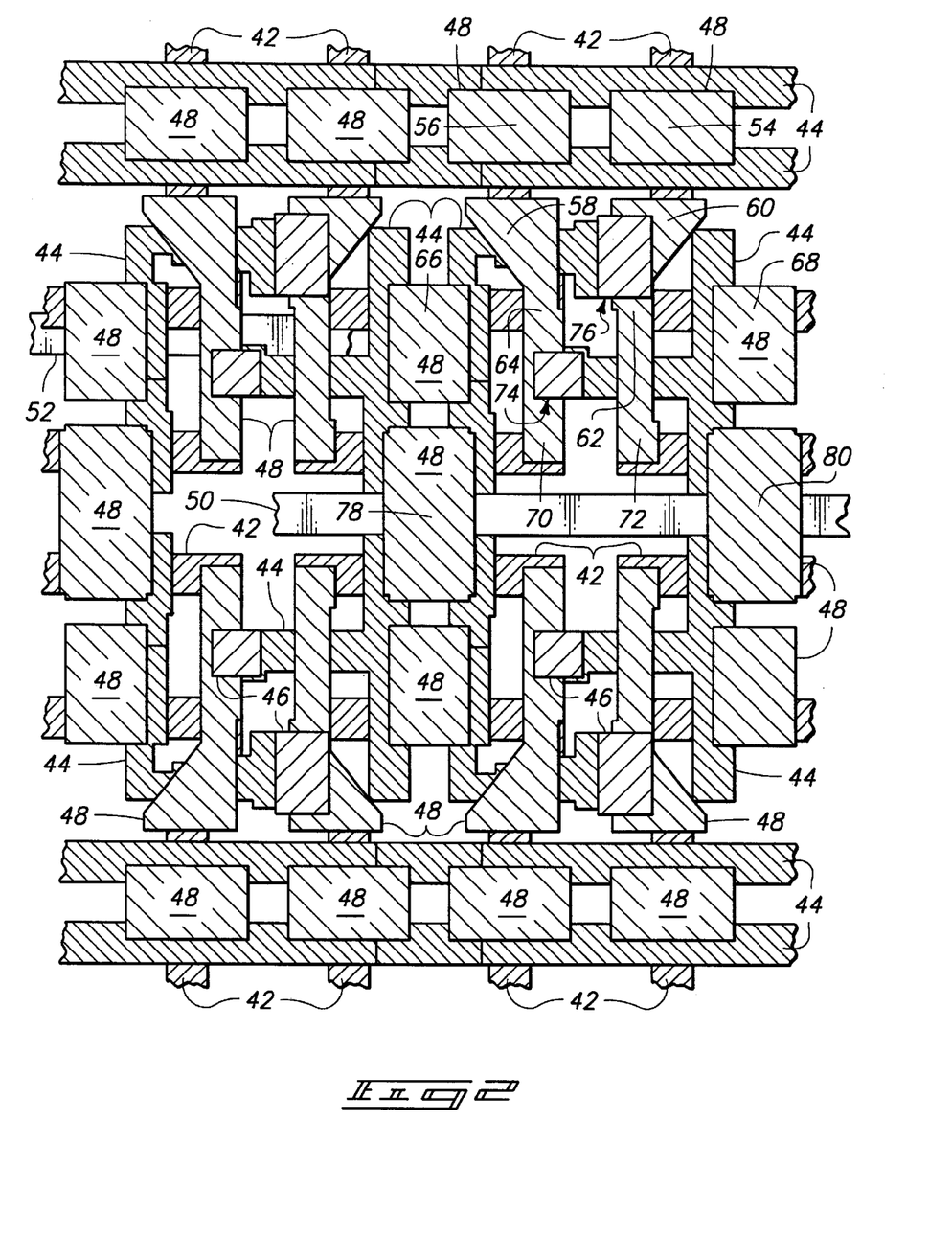
FIG. 2 is a broken away portion of circuit layout diagram illustrating a novel layout for manufacturing a plurality of static random access memory cells including cells such as the cell shown in FIG. 1.

FIG. 2 illustrates a circuit layout diagram illustrating a novel layout for manufacturing a plurality of static random access memory cells including cells such as the cell shown in FIG. 1. Circuits such as the one shown in FIG. 1 are manufactured using silicon processing techniques which are known in the art. There are many different ways of laying out any circuit on a bulk substrate.

In the layout of FIG. 2, active areas of the bulk substrate (e.g., the silicon wafer itself or doped areas beneath the wafer surface) are designated by reference numeral 42, polysilicon is designated by reference numeral 44, local interconnects (straps formed of a conductor such as Titanium Nitride) are designated by reference numeral 48, exhumed contacts are designated by reference numeral 46, Vcc metal is designated by reference numeral 50, and Vss metal is designated by reference numeral 52. The term "exhumed contact" refers to contacts which connect polysilicon to a local interconnect. This is in contrast to a buried contact.

Generally speaking, transistors are formed where polysilicon 44 intersects an active area 42. There is generally no physical distinction between the source and drain of any of the transistors shown; instead, the distinction is based on the direction of current flow when the static memory cell is connected to a power source.

In the embodiment shown in FIG. 2, of the areas shown, the order in which they are formed is as follows: active areas, then polysilicon, then local interconnects, and then exhumed contacts.

Reference numerals are provided on FIG. 2 which correspond with reference numerals shown in FIG. 1 to illustrate how the circuit of FIG. 1 is laid out in one embodiment. For example, the source of transistor P1 is indicated by reference numeral 78 in both FIGS. 1 and 2; the drain of transistor P1 is indicated by reference numeral 70; the source of transistor P2 is indicated by reference numeral 80; the drain of transistor P2 is indicated by reference numeral 72; the source of transistor N1 is indicated by reference numeral 66; the drain of transistor N1 is indicated by reference numeral 64; the source of transistor N2 is indicated by reference numeral 68; and the drain of transistor N2 is indicated by reference numeral 62 in both FIGS. 1 and 2. Remaining white regions in these layout views (FIGS. 2–3, and 6–7) represent field oxide.

Figure 3:
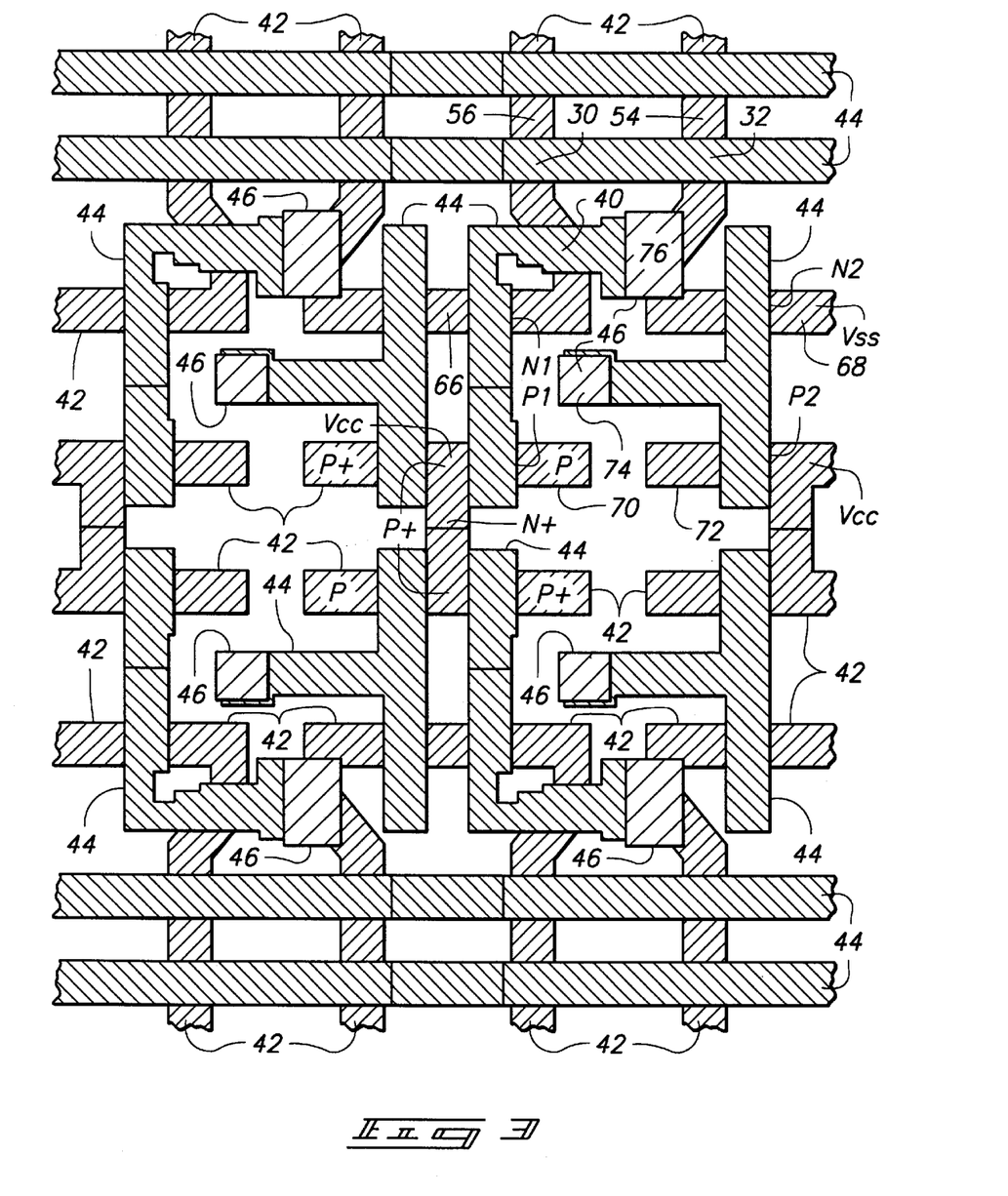
FIG. 3 illustrates the same layout shown in FIG. 2, except with information removed for increased clarity. For example, local interconnects that are shown in FIG. 2 are deleted in FIG. 3.

FIG. 3 illustrates the same layout shown in FIG. 2, except at an earlier processing step for increased clarity. For example, local interconnects, Vcc metal, and Vss metal shown in FIG. 2 are not included in FIG. 3.

As best seen in FIG. 3, the active areas 42 include areas in the general shape of a letter "H" (rotated 90°), as well as areas in the general shape of a dog bone (rotated 90°). The dog bone shaped areas are where the n-channel transistors N1 and N2 are formed, and the H-shaped regions are where the p-channel transistors P1 and P2 are formed. Accordingly, for an intrinsic p-type monocrystalline substrate, an elongated n-well is provided centrally; e.g., where the center of the H-shaped regions intersect with Vcc metal. Each SRAM cell is contained relative to two opposed legs of separate H's and two corners of separate but adjacent dogbones which are adjacent to those legs of the H's.

There is a problem relating to the spacing of the ends of H's relative to adjacent H's. During the manufacturing process, there is significant pullback of the H-shaped active areas that form the drains 70 and 72 of the pullup transistors P1 and P2. This is illustrated in FIG. 4, which represents two adjacent H-shaped active area regions 42 intersecting polysilicon 44. The adjacent H-shaped active area regions 42 are separated by field oxide in the layout shown in FIGS. 2 and 3.

The desired shape of the H-shaped regions 42 is indicated in FIG. 4 by outer dashed line 88. This is the shape of the active area as drawn on a reticle employed in defining the H-shaped regions 42. Inner dashed line 90 represents the shape of the area after photolithography (I-line 365 nm). Finally, the shape after aggressive LOCOS isolation (described above in the Background of the Invention) is illustrated with solid line 92. Encroachment takes place along two dimensions; i.e., along both the length and the width of the "H". The most extreme pullback occurs at the ends of the legs of the "H" where the drains 70 and 72 of the p-channel transistors P1 and P2 are defined. Also, the polysilicon has an associated spacer (e.g., 800 angstroms wide) which reduces the size of the active area even further.

Because of these pullback effects, the lengths of the legs of the H-shaped regions must be exaggerated so that contact can be made between the drains of the p-channel transistors P1 and P2.

The transistors P1 and P2 are defined where polysilicon 44 traverses the active area 42. Active areas 42 which are not traversed by polysilicon 44 are doped to form the source and drain regions of the transistors. The drains 70 and 72 of the p-channel transistors need to be contacted with local interconnect 48 in the layout shown in FIG. 2. If the length of the H-shaped region is not sufficiently exaggerated to account for this pullback, the active areas defined by the legs of the H-shaped regions will disappear under the polysilicon 44, and it will not be possible to contact them with the local interconnect 48. On the other hand, exaggerating the size of the H-shaped regions results in a larger size for each static random access memory cell.

Figure 5:
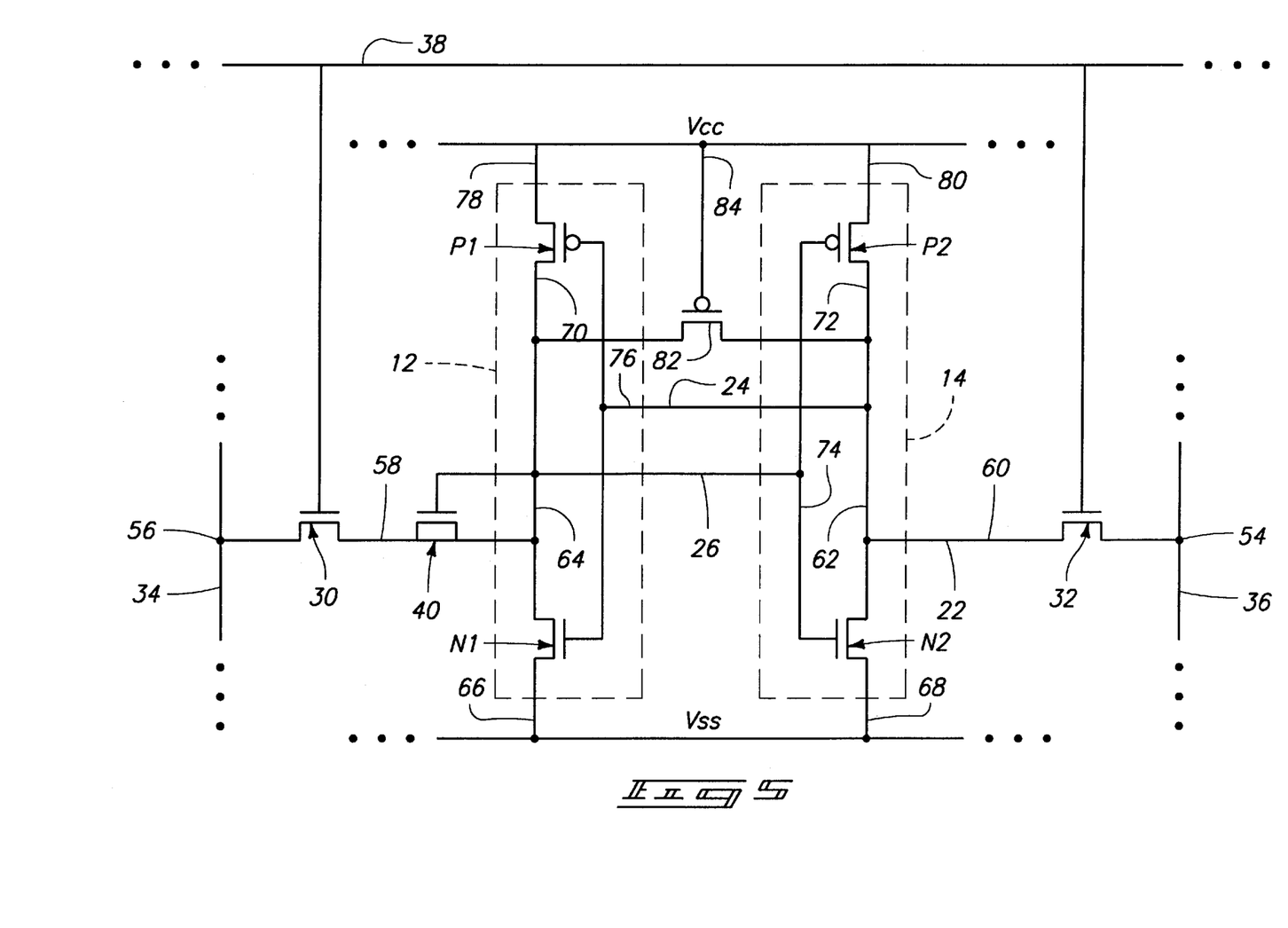
FIG. 5 is a circuit schematic of an improved static memory cell embodying another novel layout.
Figure 6:
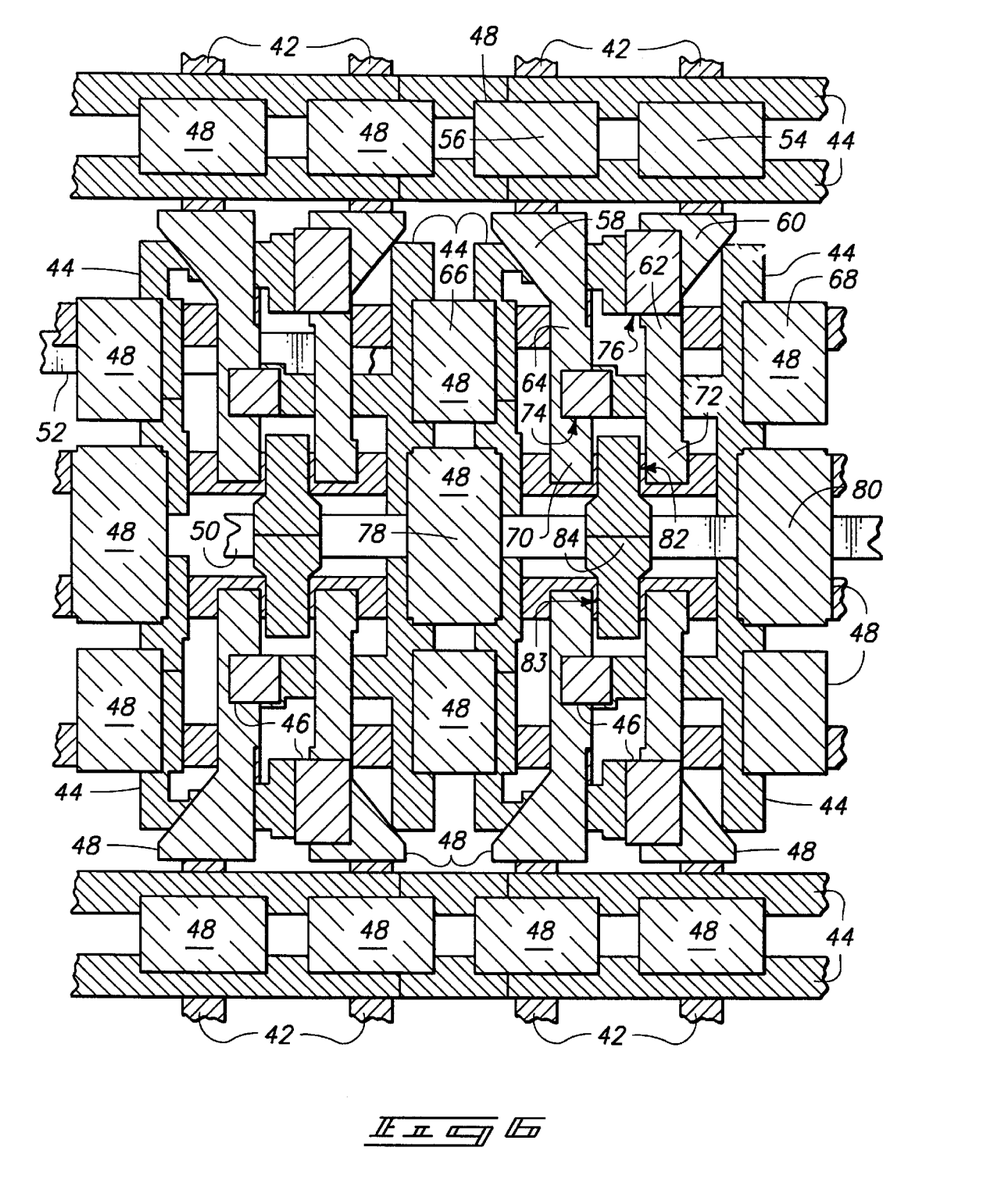
FIG. 6 is a broken away portion of a circuit layout diagram illustrating a method of manufacturing a plurality of static random access memory cells including cells such as the cell shown in FIG. 5.
Figure 11:
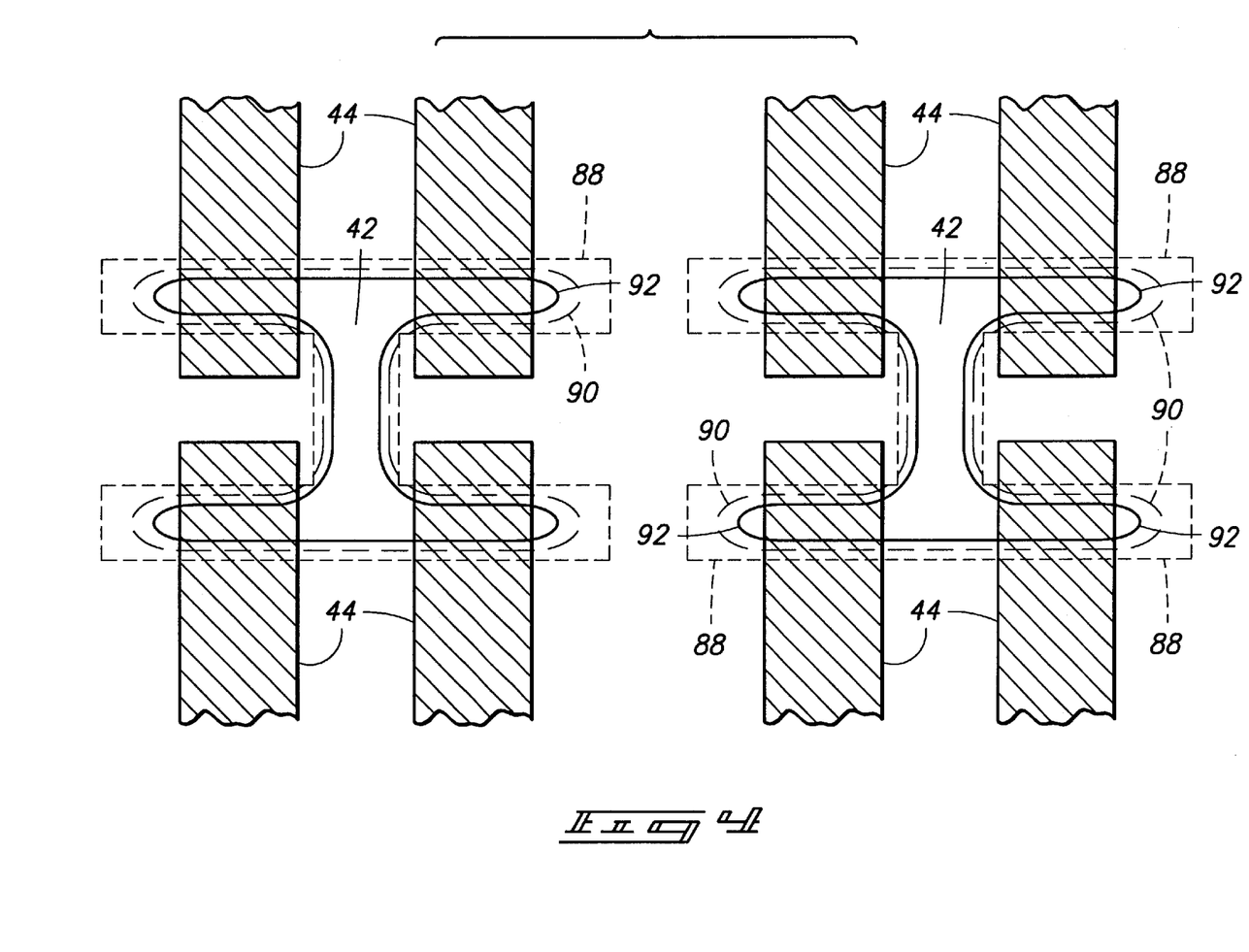

The layout shown in FIGS. 5–7 reduces this encroachment problem, and thus reduces the need to exaggerate the lengths of the legs of the H-shaped active areas, by interconnecting the ends of the active areas. Thus, instead of spaced apart H-shaped active areas, active areas in the general shape of a stepladder are formed (FIG. 7). Each ladder-shaped active area has two spaced apart parallel sides, and a plurality of parallel spaced apart areas ("rungs") extending transversely between the parallel sides. This results in space saving, so that smaller static random access memory cells are produced.

Note, however, that the purpose of separating the H-shaped active areas in the first place was to provide electrical isolation between active area regions (e.g., to provide electrical isolation between the drains 70 and 72 of the p-channel transistors P1 and P2). The two p-channel transistors P1 and P2 share a common active area in the embodiment of FIGS. 5–7. More particularly, the drains 70 and 72 of the p-channel transistors P1 and P2 share a common active area in the embodiment of FIGS. 5–7.

The inventor of the present invention has accomplished the necessary isolation by providing an isolator which isolates the pullup transistor P1 from the pullup transistor P2. More particularly, the isolator comprises an isolation gate 84 defined relative to the common active area, between the drains 70 and 72 of the p-channel transistors P1 and P2. In the illustrated embodiment, polysilicon is employed to define the isolation gate 84. By causing polysilicon 44 to intersect the common active area, an isolation p-channel transistor 82 is defined (FIG. 5) between the drains 70 and 72. Similarly, an isolation p-channel transistor 83 is defined for an adjacent memory cell.

The isolation gate is adapted to be connected to a voltage higher than Vss. More particularly, the isolation gate is adapted to be connected to a voltage sufficient to turn off (tri-state) the isolation transistor, and thus isolate drain 70 from drain 72 (except for leakage current). In one embodiment, the isolation gate 84 is connected to the sources of the p-channel transistors P1 and P2. More particularly, in the illustrated embodiment, the isolation gate 84 is connected to the Vcc metal.

Other than the common active area shared by drains 70 and 72, and the isolation gate 84, the embodiment shown in FIGS. 5–7 is substantially identical to the embodiment shown in FIGS. 2–3, like reference numerals indicating like components. The silicon processing steps employed in forming the embodiment shown in FIG. 6 is substantially identical to the silicon processing steps employed in manufacturing the embodiment shown in FIG. 2, except for the formation of the common active area (the ladder shaped active areas of FIG. 7 are formed at the same stage in the process, and in a similar manner, as the H-shaped active areas of FIG. 2). FIG. 5 also shows a parasitic transistor 40 formed because of an intersection of polysilicon with an active area, which is not shown in FIG. 1.

Thus, a layout for manufacturing static random access memory i cells has been provided which results in reduced size of each cell. Each cell includes first and second cross-coupled inverters, each inverter including a first p-channel pullup transistor, and a first n-channel pulldown transistor in series with the first p-channel pullup transistor; the first and second pullup transistors sharing a common active area; and an isolator isolating the first pullup transistor from the second pullup transistor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of manufacturing a static random access memory cell comprising:
   providing a silicon substrate;
   defining first and second inverters on the substrate, the first and second inverters respectively including p-channel transistors including respective gates, defining first and second inverters comprising forming an active area common to the drains of the p-channel transistors by doping a contiguous region in the substrate extending from the drain of one p-channel transistor to the drain of the other p-channel transistor; and
   defining an isolation gate relative to the common active area, between the drains of the p-channel transistors, by forming polysilicon on the common active area; and
   wherein contact can be made to the respective drains of the p-channel transistors with reduced need to accommodate pullback of the active area common to the drains of the p-channel transistors.

2. The method of claim 1 wherein defining first and second inverters comprises:
   forming n-channel transistors coupled respectively in series with the p-channel transistors, the p-channel transistors including respective sources and the n-channel transistors including respective sources, the method further comprising:
   coupling the sources of the p-channel transistors to a first node configured to be coupled to a first voltage;
   coupling the sources of the n-channel transistors to a second node configured to be coupled to a second voltage lower than the first voltage; and
   coupling the isolation gate to a third node configured to be coupled to a voltage higher than the second voltage.

3. The method of claim 1, further comprising coupling the isolation gate to the first node.

4. The method of claim 1 wherein the first inverter includes an output, and the second inverter includes an output, and further comprising:
   defining a first access transistor including a first active terminal coupled to the output of the first inverter, a second active terminal coupled to a first bit line, and a gate coupled to a word line; and
   defining a second access transistor including a first active terminal coupled to the output of the second inverter, a second active terminal coupled to a second bit line, and a gate coupled to the word line.

5. A method of manufacturing a static random access memory cell comprising:
   providing a silicon substrate;
   defining first and second inverters on the substrate by defining field-oxide isolated active areas for drains for a pair of n-channel transistors, sources of the n-channel transistors, and sources for a pair of p-channel transistors, and drains, and forming a common active area for drains of the p-channel transistors;
   defining gates for the p-channel transistors and for the n-channel transistors, coupling the drains of respective n-channel transistors to drains of respective p-channel transistors to define an n-channel transistor, p-channel transistor pair, and cross-coupling the n-channel transistor, p-channel transistor pairs; and
   defining an isolation gate over the common active area, between the drains of the p-channel transistors, by forming polysilicon on the common active area.

6. A method of manufacturing a static random access memory cell comprising:
   providing a silicon substrate;
   defining first and second inverters on the substrate by defining field-oxide isolated active areas for drains for a pair of n-channel transistors, sources of the n-channel transistors, and sources for a pair of p-channel transistors, and drains, and forming a common active area for drains of the p-channel transistors;
   defining gates for the p-channel transistors and for the n-channel transistors, coupling the drains of respective n-channel transistors to drains of respective p-channel transistors using local interconnects; and defining an isolation gate relative to the common active area, between the drains of the p-channel transistors, by forming polysilicon on the common active area.

7. A method of manufacturing a static random access memory cell, method comprising:

providing a p-type silicon substrate;

defining first and second inverters on the substrate by defining field-oxide isolated active areas including drains for a pair of n-channel transistors, sources of the n-channel transistors, and drains and sources for a pair of p-channel transistors;

forming a common active area for drains of the p-channel transistors by doping a contiguous region in the substrate extending from the drain of one p-channel transistor to the drain of the other p-channel transistor;

defining gates for the p-channel transistors and for the n-channel transistors;

coupling the drains of respective n-channel transistors to respective p-channel transistors; and defining an isolation gate relative to the common active area, between the drains of the p-channel transistors, by forming polysilicon on the common active area.

8. A method of manufacturing a static random access memory cell comprising:

providing a silicon substrate;

defining first and second inverters on the substrate by defining active areas for drains for a pair of n-channel transistors, sources of the n-channel transistors, and sources for a pair of p-channel transistors, and drains, and forming a common isolated active area for drains of the p-channel transistors;

defining gates for the p-channel transistors and for the n-channel transistors, coupling the drains of respective n-channel transistors to drains of respective p-channel transistors to define an n-channel transistor, p-channel transistor pair, and cross-coupling the n-channel transistor, p-channel transistor pairs; and defining an isolation gate over the common active area, between the drains of the p-channel transistors, by forming polysilicon on the common active area.

9. A method of manufacturing a static random access memory cell comprising:

providing a silicon substrate;

defining first and second inverters on the substrate, the first and second inverters respectively including p-channel transistors including respective gates, defining first and second inverters comprising forming a field-oxide isolated active area common to the drains of the p-channel transistors by doping a contiguous region in the substrate extending from the drain of one p-channel transistor to the drain of the other p-channel transistor; and defining an isolation gate relative to the common active area, between the drains of the p-channel transistors, by forming polysilicon on the common active area;

wherein contact can be made to the respective drains of the p-channel transistors with reduced need to accommodate pullback of the active area common to the drains of the p-channel transistors.

10. The method of claim 9 wherein defining first and second inverters comprises:

forming n-channel transistors coupled respectively in series with the p-channel transistors, the p-channel transistors including respective sources and the n-channel transistors including respective sources, the method further comprising:

coupling the sources of the p-channel transistors to a first node configured to be coupled to a first voltage;

coupling the sources of the n-channel transistors to a second node configured to be coupled to a second voltage lower than the first voltage; and coupling the isolation gate to a third node configured to be coupled to a voltage higher than the second voltage.

11. The method of claim 9 wherein the first inverter has an output, and wherein the second inverter has an output, and further comprising:

defining a first access transistor including a first active terminal coupled to the output of the first inverter, a second active terminal coupled to a first bit line, and a gate coupled to a word line; and defining a second access transistor including a first active terminal coupled to the output of the second inverter, a second active terminal coupled to a second bit line, and a gate coupled to the word line.

12. A method of manufacturing a static random access memory cell comprising:

providing a silicon substrate;

defining first and second inverters on the substrate, the first and second inverters respectively including p-channel transistors including respective gates, drains and sources;

defining first and second inverters by forming a field-oxide isolated active area common to the drains of the p-channel transistors by doping a contiguous region in the substrate extending from the drain of one p-channel transistor to the drain of the other p-channel transistor; and defining an isolation gate relative to the common active area, between the drains of the p-channel transistors, by forming polysilicon on the common active area.

13. The method of claim 12 wherein defining the first and second inverters comprises forming n-channel transistors respectively in series with the p-channel transistors, sources of the p-channel transistors coupled to a first node configured to be coupled to a first voltage, the n-channel transistors including respective sources coupled to a second node configured to be coupled to a second voltage lower than the first voltage, wherein the isolation gate is coupled to a third node configured to be coupled to a voltage higher than the second voltage.

14. The method of claim 12 wherein defining the first and second inverters comprises forming n-channel transistors respectively in series with the p-channel transistors, sources of the p-channel transistors being coupled to a first node configured to be coupled to a first voltage, the n-channel transistors including respective sources coupled to a second node configured to be coupled to a second voltage lower than the first voltage, wherein the isolation gate is coupled to the first node.

15. The method of claim 12 wherein the first inverter has an output, and wherein the second inverter has an output, and further comprising:

defining a first access transistor including a first active terminal coupled to the output of the first inverter, a second active terminal coupled to a first bit line and a gate coupled to a word line; and defining a second access transistor including a first active terminal coupled to the output of the second inverter, a second active terminal coupled to a second bit line and a gate coupled to the word line.

* * * * *

UNITED STATES PATENT AND TRADEMARK OFFICE
CERTIFICATE OF CORRECTION

PATENT NO.   : 6,301,148 B1
DATED        : October 9, 2001
INVENTOR(S)  : Michael P. Violette It is certified that error appears in the above-identified patent and that said Letters Patent is hereby corrected as shown below:

Column 1,
Line 56, replace "values, blut requires" with -- values, but requires --

Column 2,
Line 10, replace "transistors Ni and N2," with -- transistors N1 and N2, --
Line 16, replace "transistors or bull devices." with -- transistors or bulk devices. --

Column 3,
Line 12, replace "such as flverters and" with -- such as inverters and --
Line 15, replace "other device s within" with -- other devices within --
Line 31, replace "has beer termed" with -- has been termed --

Column 4,
Line 62, replace "transistors" with -- transistors. --

Column 7,
Line 38, replace "memory i cells" with -- memory cells --

Column 9,
Line 5, replace "cell, method" with -- cell, the method --

Signed and Sealed this

Thirtieth Day of April, 2002

*Attest:*

*Attesting Officer*

JAMES E. ROGAN
*Director of the United States Patent and Trademark Office*